(12) United States Patent
Dong et al.

(10) Patent No.: US 11,703,755 B2
(45) Date of Patent: *Jul. 18, 2023

(54) FIDUCIAL DESIGN

(71) Applicant: Magic Leap, Inc., Plantation, FL (US)

(72) Inventors: Huihang Dong, Weston, FL (US); Ryan Rieck, Plantation, FL (US); Thomas Mercier, Weston, FL (US)

(73) Assignee: Magic Leap, Inc., Plantation, FL (US)

( * ) Notice: Subject to any disclaimer, the term of this patent is extended or adjusted under 35 U.S.C. 154(b) by 114 days.

This patent is subject to a terminal disclaimer.

(21) Appl. No.: 17/364,498

(22) Filed: Jun. 30, 2021

(65) Prior Publication Data
US 2021/0405269 A1 Dec. 30, 2021

Related U.S. Application Data

(63) Continuation of application No. 15/993,408, filed on May 30, 2018, now Pat. No. 11,079,522.
(Continued)

(51) Int. Cl.
*G02B 5/18* (2006.01)
*G02B 27/32* (2006.01)
(Continued)

(52) U.S. Cl.
CPC .......... *G03F 7/0002* (2013.01); *G02B 5/1852* (2013.01); *G02B 5/1861* (2013.01);
(Continued)

(58) Field of Classification Search
CPC G02B 5/1852; G02B 5/1861; G02B 27/0012; G02B 27/32; G03F 7/0002;
(Continued)

(56) References Cited

U.S. PATENT DOCUMENTS

| 4,852,988 A | 8/1989 | Velez |
| 6,433,760 B1 | 8/2002 | Vaissie |

(Continued)

FOREIGN PATENT DOCUMENTS

| CA | 2316473 A1 | 1/2001 |
| CA | 2362895 A1 | 12/2002 |

(Continued)

OTHER PUBLICATIONS

Final Office Action dated Nov. 12, 2020, for U.S. Appl. No. 15/993,408, filed May 30, 2018, sixteen pages.

(Continued)

*Primary Examiner* — Collin X Beatty
*Assistant Examiner* — Grant A Gagnon
(74) *Attorney, Agent, or Firm* — Morrison & Foerster LLP

(57) ABSTRACT

Methods and apparatuses related to fiducial designs for fiducial markers on glass substrates, or other transparent or translucent substrates, are disclosed. Example fiducial designs can facilitate visual recognition by enhancing edge detection in visual perception. In example fiducial designs, optical features on glass substrates can re-direct light so as to present a bright image region. Such optical features can include surface relief patterns formed in a coating on the surface of glass substrates. An exemplary method for manufacturing the fiducial markers can involve transfers of a fiducial design across a master mold or plate, a submaster mold or plate, and a target glass substrate. A fiducial marker can facilitate the use of the substrate in a variety of applications, including machine vision systems that facilitate automated performance of manufacturing processes on input working material.

8 Claims, 10 Drawing Sheets

Related U.S. Application Data

(60) Provisional application No. 62/513,299, filed on May 31, 2017.

(51) Int. Cl.
| | |
|---|---|
| *G02B 27/00* | (2006.01) |
| *G03F 7/00* | (2006.01) |
| *G03F 9/00* | (2006.01) |
| *G06T 7/73* | (2017.01) |
| *G06T 7/00* | (2017.01) |
| *G06V 10/44* | (2022.01) |

(52) U.S. Cl.
CPC ......... *G02B 27/0012* (2013.01); *G02B 27/32* (2013.01); *G03F 9/7042* (2013.01); *G06T 7/0006* (2013.01); *G06T 7/73* (2017.01); *G06V 10/44* (2022.01); *G06T 2207/30204* (2013.01)

(58) Field of Classification Search
CPC ....... G03F 9/7042; G06T 7/73; G06T 7/0006; G06T 2207/30204; G06V 10/751
USPC .......................................................... 359/569
See application file for complete search history.

(56) References Cited

U.S. PATENT DOCUMENTS

| | | |
|---|---|---|
| 6,491,391 B1 | 12/2002 | Blum et al. |
| 6,847,336 B1 | 1/2005 | Lemelson |
| 6,943,754 B2 | 9/2005 | Aughey |
| 6,977,776 B2 | 12/2005 | Volkenandt et al. |
| 7,347,551 B2 | 3/2008 | Fergason et al. |
| 7,488,294 B2 | 2/2009 | Torch |
| 7,965,820 B2 | 6/2011 | Miller et al. |
| 8,235,529 B1 | 8/2012 | Raffle |
| 8,611,015 B2 | 12/2013 | Wheeler |
| 8,638,498 B2 | 1/2014 | Bohn et al. |
| 8,696,113 B2 | 4/2014 | Lewis |
| 8,929,589 B2 | 1/2015 | Publicover et al. |
| 9,010,929 B2 | 4/2015 | Lewis |
| 9,274,338 B2 | 3/2016 | Robbins et al. |
| 9,292,973 B2 | 3/2016 | Bar-zeev et al. |
| 9,720,505 B2 | 8/2017 | Gribetz et al. |
| 10,013,053 B2 | 7/2018 | Cederlund et al. |
| 10,025,379 B2 | 7/2018 | Drake et al. |
| 11,079,522 B1 | 8/2021 | Dong et al. |
| 2003/0030597 A1 | 2/2003 | Geist |
| 2006/0023158 A1 | 2/2006 | Howell et al. |
| 2011/0211056 A1 | 9/2011 | Publicover et al. |
| 2011/0213664 A1 | 9/2011 | Osterhout |
| 2012/0021806 A1 | 1/2012 | Maltz |
| 2012/0299138 A1 | 11/2012 | Rauker et al. |
| 2014/0195918 A1 | 7/2014 | Friedlander |
| 2015/0168731 A1 | 6/2015 | Robbins |

FOREIGN PATENT DOCUMENTS

| | | |
|---|---|---|
| CA | 2388766 A1 | 12/2003 |
| EP | 0886163 A2 | 12/1998 |

OTHER PUBLICATIONS

Köhler, J. et al. (2010). "Detection and Identification Techniques for Markers Used in Computer Vision," Department of Augmented Vision, German Research Center for Artificial Intelligence GmbH, Trippstadter Str. 122, 67663 Kaiserslautern, Germany, 9 pages.

Non-Final Office Action dated Apr. 3, 2020, for U.S. Appl. No. 15/993,408, filed May 30, 2018, sixteen pages.

Notice of Allowance dated Mar. 31, 2021, for U.S. Appl. No. 15/993,408, filed May 30, 2018, eleven pages.

Jacob, R. "Eye Tracking in Advanced Interface Design", Virtual Environments and Advanced Interface Design, Oxford University Press, Inc. (Jun. 1995).

Rolland, J. et al., "High-resolution inset head-mounted display", Optical Society of America, vol. 37, No. 19, Applied Optics, (Jul. 1, 1998).

Tanriverdi, V. et al. (Apr. 2000). "Interacting With Eye Movements In Virtual Environments," Department of Electrical Engineering and Computer Science, Tufts University, Medford, MA 02155, USA, Proceedings of the SIGCHI conference on Human Factors in Computing Systems, eight pages.

Yoshida, A. et al., "Design and Applications of a High Resolution Insert Head Mounted Display", (Jun. 1994).

FIDUCIAL DESIGN

CROSS REFERENCE TO RELATED APPLICATION

This application is a continuation of U.S. patent application Ser. No. 15/993,408, filed May 30, 2018, which claims benefit of U.S. Provisional Patent Application No. 62/513,299, filed May 31, 2017, the disclosure of which is incorporated herein by reference in its entirety for all purposes.

FIELD

This disclosure generally relates to fiducial design, including fiducial designs on transparent or translucent substrates (e.g., glass). These fiducial designs can enhance visual edge contrast, which can enhance detection of visual edges by, e.g., machine vision systems.

BACKGROUND

Fiducial markers (or "fiducials") are markings on an object that provide a visual point of reference. Fiducial markers find use in manufacturing and in other applications that may require a distinct, recognizable, and trustworthy visual point of reference, for example, to aid in precise placement or alignment of objects. For example, fiducial markers may be found in systems where visual alignment or visual orientation is important, such as machine vision systems that detect misalignment or that achieve or maintain a target alignment or a target orientation.

One exemplary application is a manufacturing process for a printed circuit board (PCB). PCBs often require the precise placement of components (such as electronic or electromechanical components) on a surface. As assisting aids, a PCB can have one or more fiducial markers visible on the surface of the PCB. During the manufacturing process, automated robotic machines, commonly known as pick-and-place machines (P&Ps), may utilize machine vision systems to locate and place components on a PCB based on the fiducial markers on the PCB. A machine vision system of the P&P may have a machine vision camera that can image the PCB's fiducial markers and an image processing system that can analyze an image to recognize the PCB's fiducial markers. The P&P's vision system can use the positions of the PCB's fiducial markers to determine the orientation of the PCB. The P&P can determine where to place a given component on the PCB, with respect to one or more fiducials on the PCB, by determining the target placement location for the component relative to the one or more fiducials in the PCB's surface layout plan, which can be stored in the P&P's memory. Consequently, the P&P can actually place the given component on the PCB accurately at the target placement location with respect to the one or more fiducials on the PCB.

In some fiducial marker applications relating to PCBs, a fiducial marker may be a circular area of bare copper plating of an inner layer of the PCB, exposed at the top surface of the PCB to be visible to a machine vision system.

BRIEF SUMMARY

Examples of the disclosure describe methods and apparatuses related to fiducial designs for fiducial markers on glass substrates, or other transparent or translucent substrates. Example fiducial designs can facilitate visual recognition by enhancing edge detection in visual perception by humans or machine vision systems. Example fiducial designs can employ optical features on glass substrates that re-direct light so as to present a bright image region to an observer. Such optical features can include surface relief patterns formed in a coating on the surface of glass substrates.

An exemplary manufacturing method can be used to implement example fiducial designs to manufacture fiducial markers. Manufacturing the fiducial markers can involve two transfers of a fiducial design across multiple substrates. In a first transfer, a target fiducial design can be conveyed by a pattern on a master mold or plate. The master can have a surface relief profile corresponding to the target fiducial design to be made. Then, the target fiducial design patterned on the master can be transferred as a negative of the fiducial design to a submaster mold or plate. In a second transfer, the submaster can convey a negative of the target fiducial design to a coating of hardenable (photocurable) material on a target glass substrate. The positive pattern on the hardenable coating on the glass substrate can form a fiducial marker having the target fiducial design.

After a substrate is marked with a fiducial marker, the fiducial marker can facilitate the use of the substrate in a variety of applications. Exemplary applications include manufacturing processes in industrial environments where fiducial markers can be useful for providing visual points of reference, such as for precision alignment of components on the substrate or precision alignment of the substrate in a cutting machine that cuts the substrate into multiple parts (e.g., augmented reality eyepieces). Example fiducial markers can aid machine vision systems that facilitate automated performance of manufacturing processes on input working material.

DETAILED DESCRIPTION

Figure 1A:
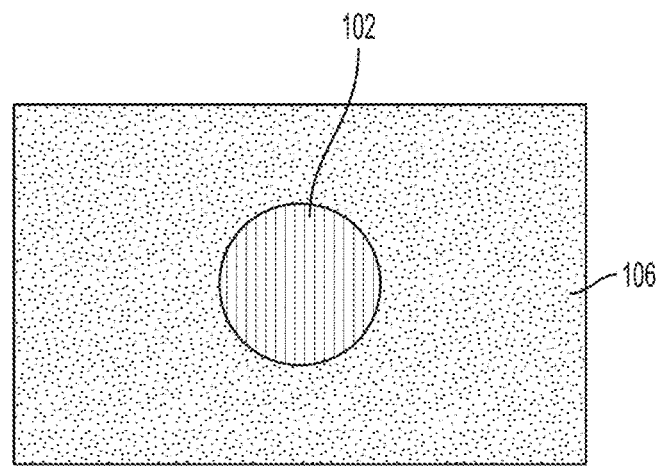
FIG. 1A illustrates a top view of an example fiducial marker design ("Design A"), according to examples of the disclosure.

In the following description of examples, reference is made to the accompanying drawings which form a part hereof, and in which it is shown by way of illustration specific examples that can be practiced. It is to be understood that other examples can be used and structural changes can be made without departing from the scope of the disclosed examples.

Although examples disclosed herein may be described and illustrated with respect to specific substrate materials, such as glass substrates, it should be understood that the disclosure is not limited to particular substrate materials. Further, although examples disclosed herein may be described with respect to exemplary usage of fiducial markers in machine vision systems, or applications thereof (such as in automated manufacturing equipment), the disclosure is not limited to any particular use or application of fiducial markers or machine vision systems.

To serve as a useful visual point of reference, a fiducial marker should be visually recognizable against a background. For example, a fiducial marker may present a visual distinction (such as a change in image intensity values) between an image region including the fiducial marker itself and another (background) image region visually presenting the area surrounding or adjacent to the fiducial marker. A visual distinction between two such image regions may be used to identify a visual edge, such as by a machine vision system. A vision system can use an edge detection process to detect such a visual edge in order to identify and locate fiducial markers on a target substrate, such as a glass substrate.

Two image regions can be visually distinct in a variety of aspects. For example, brightness or light intensity levels in a digital image can be analyzed to identify visually distinct image regions in the image. In some examples, a machine vision system can thus detect an edge between a bright (high light intensity) image region and a dark (low light intensity) image region. In the PCB manufacturing process discussed above, for instance, a bare copper fiducial can be much more reflective than its surrounding material on the PCB surface. In a front-lit field of view of the vision system, the bare copper fiducial may appear as a sharply bright image region surrounded by a dark image region. The vision system may be able to easily detect the PCB fiducial due to the high brightness contrast between these two regions.

Glass substrates, unlike reflective and opaque surfaces such as bare copper, may be primarily transmissive of light. Instead of providing a bright image region useful for providing an effective fiducial marker, an area of flat glass may not appear as a highly distinctive image region to a machine vision system. Thus, simply shining light on an area of flat glass may not provide sufficiently high brightness contrast for useful edge detection. Other means of edge detection may thus be desirable. In some examples, fiducial markers can be specially designed to facilitate detection of the edges of the fiducial markers.

Examples disclosed below teach fiducial designs for fiducial markers on glass substrates, or other transparent or translucent substrates. These fiducial designs can facilitate visual recognition, for example, by enhancing edge detection in visual perception by observers, such as humans or machine vision systems. Some example fiducial designs can employ optical features on glass substrates that re-direct light so as to present a bright image region to an observer according to a particular design. Such optical features can include surface relief patterns formed in a coating on the surface of glass substrates.

An exemplary application for fiducial markers on transparent substrates is transparent substrates with diffractive optical features formed in a photocurable (e.g., ultraviolet light curable) coating on the surface of the transparent substrate. The diffractive optical features are formed on a blank substrate and the final shape is cut from the blank substrate. Because the substrate and the photocurable (e.g., ultraviolet light curable) coating are both transparent, an observer can have difficulty in properly locating the cut lines along which the blank substrate is to be cut in order to define the final shape. The teachings below can address this difficulty by providing fiducial markers that provide visual points of reference on the transparent substrates.

Design A

FIG. 1A illustrates a top view of an example fiducial marker design ("Design A") in which a course spacing surface relief profile area 102 is located on the surface of a glass substrate. The course spacing surface relief profile area 102 may be a circular area in which straight bars are oriented in a vertical direction. The surrounding area 106 may be a relatively blank area of field material. Exemplary specifications for the course spacing surface relief profile area 102 include a diameter of 2 mm and a pitch of 20 µm (sum of 10-µm width of one bar and 10-µm width of one adjacent space), or a linewidth of 10 µm and a space of 10 (linewidth/space of 10 µm).

Figure 1B:
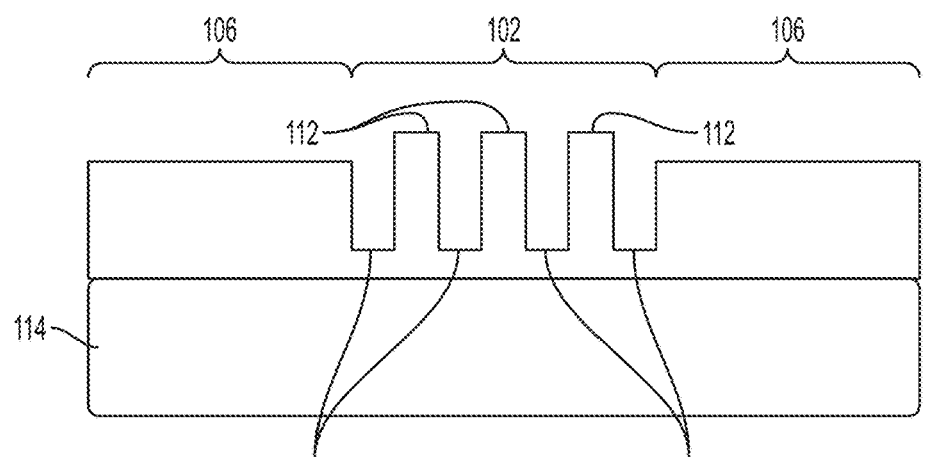
FIG. 1B illustrates a cross-sectional view of Design A, according to examples of the disclosure.

FIG. 1B illustrates a cross-sectional view of Design A. The principal base layer can be a glass substrate 114. The course spacing surface relief profile area 102 can be located above the upper surface of the glass substrate 114. In Design A, the course spacing surface relief profile area 102 can be the area with periodically spaced feature bars 112 that extend vertically from the substrate 114 in FIG. 1B, and the surrounding area 106 can be the relatively blank area with no features in FIG. 1B. The course spacing surface relief profile area 102 may be formed from a photocurable material that has been shaped, e.g., in a nanoimprinting process. Exemplary specifications for the course spacing surface relief profile area 102 include a base layer thickness of 20 nm under the vertical feature bars 112 and a blank area layer thickness of 75-105 nm.

Design A, when illuminated, can show highly contrasted image regions. The course spacing surface relief profile area 102 can exhibit a relatively high reflectivity, and so can appear as a bright area. The surrounding area 106 can exhibit a relatively low reflectivity, and so can appear as a dark area. Where these two image regions meet, visual edges can be detected by an observer, such as a machine vision system. As the visual edges delineate the shape of the fiducial marker's design, the vision system can recognize the fiducial marker based on the detected edges.

Figure 1C:
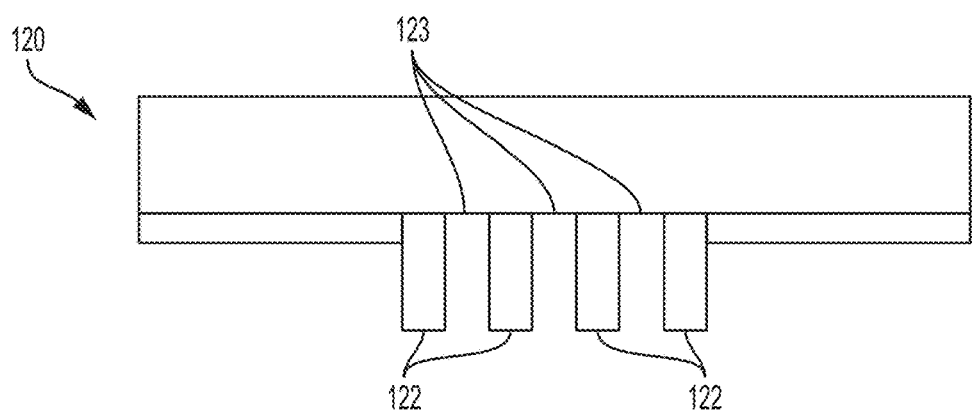
FIG. 1C illustrates Submaster A, according to examples of the disclosure.

FIG. 1C illustrates Submaster A, which is an example submaster plate 120 that can be used to implement Design A on a glass substrate 114. In general, a submaster mold or plate (or submaster for short) can be developed based on a master mold or plate (or master for short) having a pattern that conveys a target fiducial design. The master can transfer a negative of the target fiducial design to the submaster, which can then transfer a positive pattern of the target fiducial design to a target (e.g., glass) substrate. In brief, Submaster A can be a negative surface relief tool. When Submaster A is pressed upon a flat layer of photoresist, the positive surface relief pattern of Design A is impressed upon the layer of photoresist. For instance, the protruding ridges 122 of Submaster A press into the photoresist to form the low grooves 113 in Design A, and the recesses 123 of Submaster A form the vertical feature bars 112 in Design A. When Submaster A is lifted away, Design A remains on the glass substrate 114.

Design B

Figure 2A:
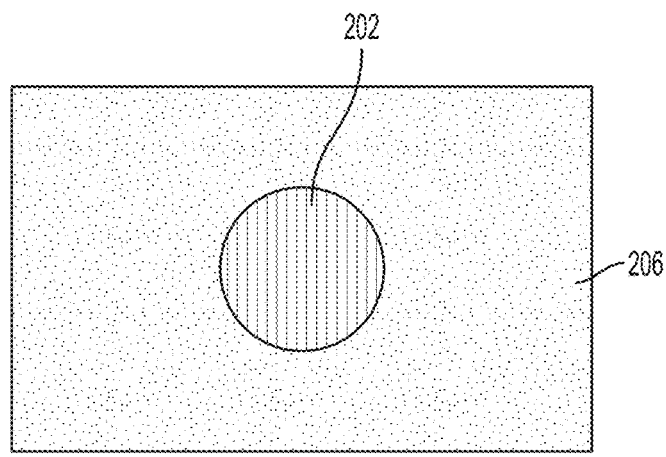
FIG. 2A illustrates a top view of an example fiducial marker design ("Design B"), according to examples of the disclosure.

FIG. 2A illustrates a top view of an example fiducial marker design ("Design B") in which a course spacing surface relief profile area 202 is located on the surface of a glass substrate. Compared to Design A, Design B features a surrounding blank area 206 that can be significantly thinner than the surrounding blank area 106 in Design A.

Figure 2B:
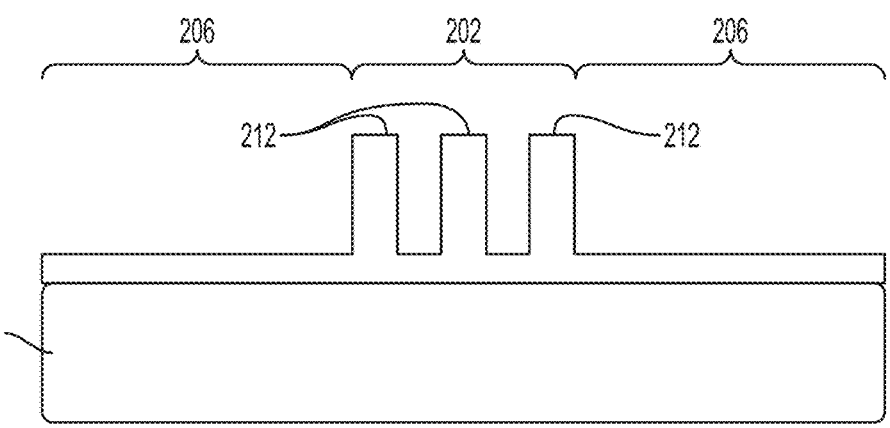
FIG. 2B illustrates a cross-sectional view of Design B, according to examples of the disclosure.

FIG. 2B illustrates a cross-sectional view of Design B. This view shows that the top of the surrounding blank area 206 is near or at the level of the base layer thickness under the vertical feature bars 212.

Design B, when illuminated, can show highly contrasted image regions, similar to Design A. In Design B, however, the course spacing surface relief profile area 202 can protrude higher above the surrounding blank area 206. Whereas the course spacing surface relief profile area 106 in Design A may be a physically more recessed optical feature, the course spacing surface relief profile area 202 in Design B may be a physically more prominent optical feature on the surface of the glass substrate 214.

Figure 2C:
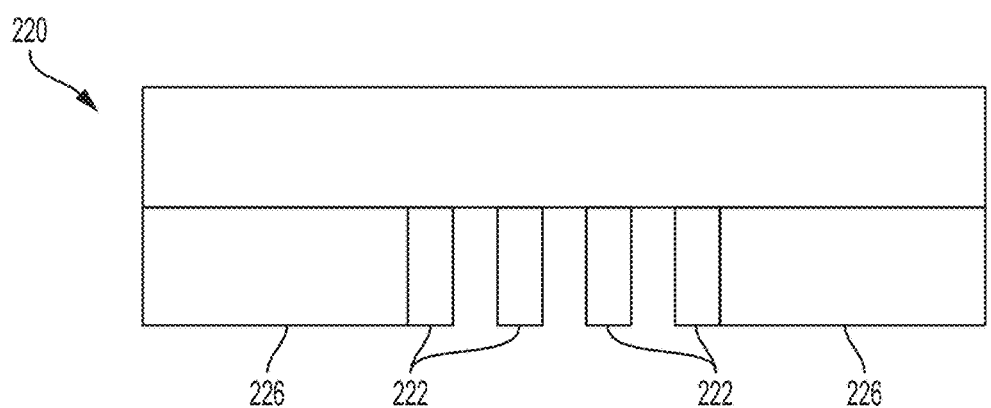
FIG. 2C illustrates Submaster B, according to examples of the disclosure.

FIG. 2C illustrates Submaster B, which is an example submaster plate 220 that can be used to implement Design B on a glass substrate 214. Compared to Submaster A as shown in FIG. 1C, the blocks 226 that form the surrounding blank area 206 in Submaster B can protrude further down to be near or at the level of the protruding ridges 222 that form the surface relief profile area 202 in Design B.

Figure 2D:
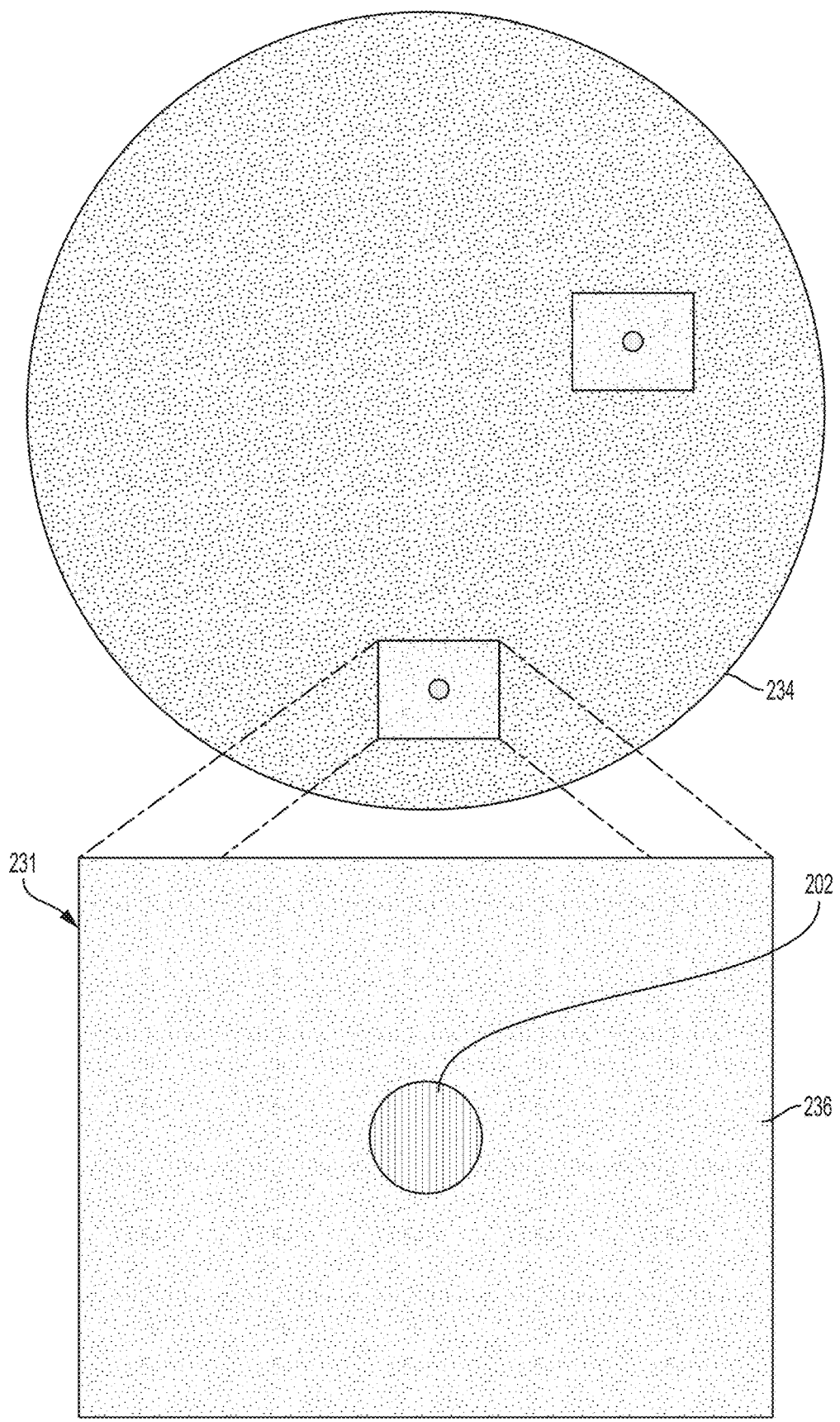
FIG. 2D illustrates an example Zone Design B that includes Design B, according to examples of the disclosure.

FIG. 2D illustrates an example Zone Design B that includes Design B. Zone Design B may have a rectangular area 231 in which the course surface relief profile area 202 of Design B can be centrally located in a surrounding blank area 236 that can fill out the rectangular area 231. Outside of a fiducial marker having Zone Design B, other features or materials may (but need not) occupy space on the glass substrate 234. Zone Design B (including Design B) may be relatively easier for a machine vision system to recognize: instead of performing fiducial marker recognition based just on detecting a bright circular area (as in Design A or Design B), the vision system can perform more precise fiducial marker recognition based on detecting the more specific fiducial design of a bright circular area within a rectangular area having relatively uniform darkness. Exemplary specifications for the rectangular area 231 of Zone Design B include a height of 10 mm and a width of 12.4 mm.

Design C

Figure 3A:
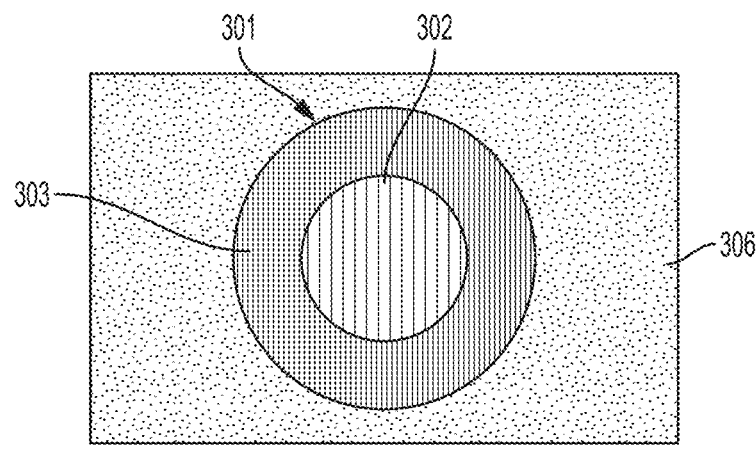
FIG. 3A illustrates a top view of an example fiducial marker design ("Design C"), according to examples of the disclosure.

FIG. 3A illustrates a top view of an example fiducial marker design ("Design C") in which a surface relief profile area 301 is located on the surface of a glass substrate, within a surrounding blank area 306. In Design C, compared to Design A, there is a fine spacing surface relief profile area 303 disposed between a circular coarse spacing surface relief profile area 302 and the surrounding blank area 306. This fine spacing surface relief profile area 303 may be an annular (ring-shaped) area in which straight bars are oriented in a vertical direction. Exemplary specifications for the (annular) fine spacing surface relief profile area 303 include an inner diameter of 1.0 mm, an outer diameter of 2.0 mm, and a linewidth/space of 0.23-1.0 μm.

Figure 3B:
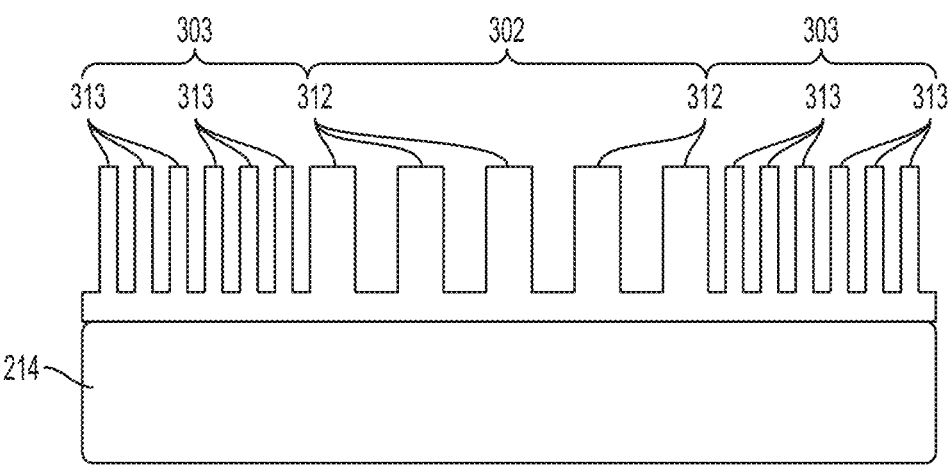
FIG. 3B illustrates a cross-sectional view of Design C, according to examples of the disclosure.

FIG. 3B illustrates a cross-sectional view of Design C. The course spacing surface relief profile area 302 in Design C is as described with respect to the course spacing surface relief profile areas 102 and 202 in Designs A and B. In Design C, however, the course spacing surface relief profile area 302 can be encircled by the fine spacing surface relief profile area 303. In the example shown, both the fine and course spacing relief profile areas 302 and 303 have vertical feature bars 312 and 313 of the same height.

Design C, when illuminated, can provide highly contrasted image regions. The course spacing surface relief profile area 302 can exhibit a relatively high reflectivity, and so can appear as a bright area, and the surrounding blank area 306 can appear as a dark area, similar to Design A. In Design C, the annular fine spacing surface relief profile area 303 can also exhibit a low reflectivity, and so can also appear as a dark area. This fine spacing surface relief profile area 303 in Design C can also introduce an additional visual effect to modify the visual appearance of Design A.

In Design A, incident light can be reflected by the circular course spacing surface relief profile area 302 so as to reflect light with a relatively high reflectivity. In some implementations, outside of the circular edge of the course spacing surface relief profile area 302, the reflectivity may decrease gradually around the bright circular course spacing surface relief profile area 302. In some cases, given certain conditions, this gradual decrease in light reflectivity can visually blur the circular edge so as to impair or interfere with edge detection by a machine vision system. If the vision system cannot suitably detect the circular edge of Design A, the vision system may be unable to recognize Design A as a fiducial marker. Without limitation, one potential explanation for the blur is that, when the course spacing surface relief profile area 302 is formed, there can be an accompanying manufacturing result in the form of a net displacement of material outside of the course spacing surface relief profile area that may cause a radially varying thickness of the photocurable (e.g., ultraviolet light curable) material immediately outside the course spacing surface relief profile area 302. The region of radially varying thickness may contribute to a radially varying reflectivity, which may contribute to the blur at the circular edge of the course spacing surface relief profile area 302.

In Design C, the annular fine spacing surface relief profile area 303 may reduce or eliminate radially varying reflectivity problems that may occur, such as with Design A. The fine spacing surface relief profile area 303 can have a finer pitch than the course spacing surface relief profile area 302, and exemplary linewidth/space values may include 0.23-1.0 μm. These pitch values may encompass wavelengths of the visible light spectrum, which is a spectral range around 400-700 nm. Compared to the circular course spacing surface relief profile area 302, the annular fine spacing surface relief profile area 303 can appear relatively dark. The resulting visual effect may be the reduction or elimination of glow that may appear outside of the circular course spacing surface relief profile area 302, and thus reduce or eliminate visual blurring that may occur at the circular edge of the course spacing surface relief profile area 302. With less visual blur, a sharper edge of contrasting brightness may be formed between the bright area of the circular course spacing surface relief profile area 302 and the dark area of the annular fine spacing surface relief profile area 303. This sharper edge of contrasting brightness at the circular edge can facilitate edge detection by a vision system, in turn allowing the shape of the circular edge in a fiducial marker of Design C to be more easily recognized by the vision system.

Figure 3C:
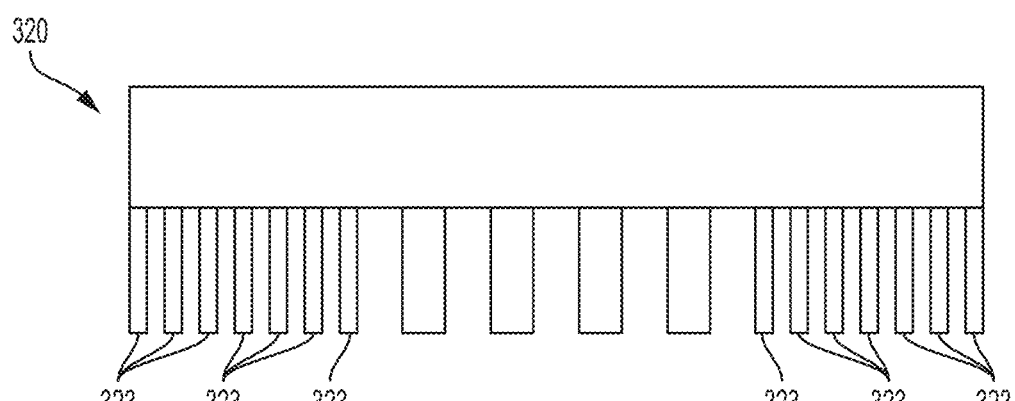
FIG. 3C illustrates Submaster C, according to examples of the disclosure.

FIG. 3C illustrates Submaster C, which is an example submaster plate 320 that can be used to implement Design C on a glass substrate 314. Compared to Submaster B, which exhibits wide blocks 226 that protrude down to be near or at the level of the protruding ridges 222 that form the circular course spacing surface relief area 202 in Design B, Submaster C can exhibit narrow protruding ridges 323 that form the annular fine spacing surface relief profile area 303 in Design C.

Figure 3D:
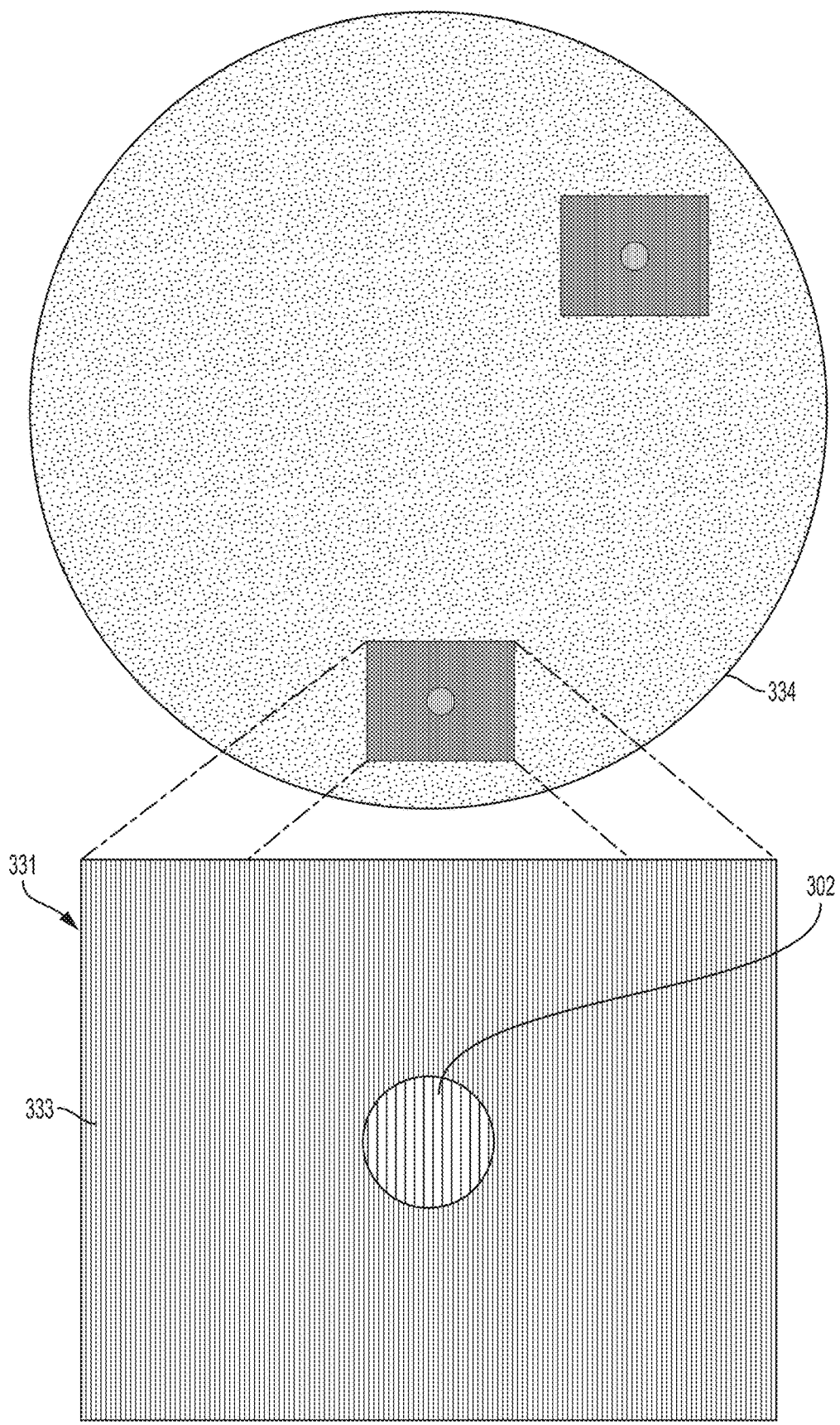
FIG. 3D illustrates an example Zone Design C that can include aspects of Design C, according to examples of the disclosure.

FIG. 3D illustrates an example Zone Design C that can include aspects of Design C. In Zone Design C, the shape and size of the annular fine spacing surface relief profile area 303 of Design C may be expanded to fill out a larger rectangular area 331. Compared to Zone Design B, which features a surrounding blank area 236, Zone Design C instead may feature a fine spacing surface relief profile area 333 (analogous to Design C). Outside of a fiducial marker having Zone Design C, other features or materials may (but need not) occupy space on the glass substrate 334. Zone Design C may be recognizable by a machine vision system detecting a bright circular area within a rectangular area having relatively uniform darkness.

Design D

Figure 4A:
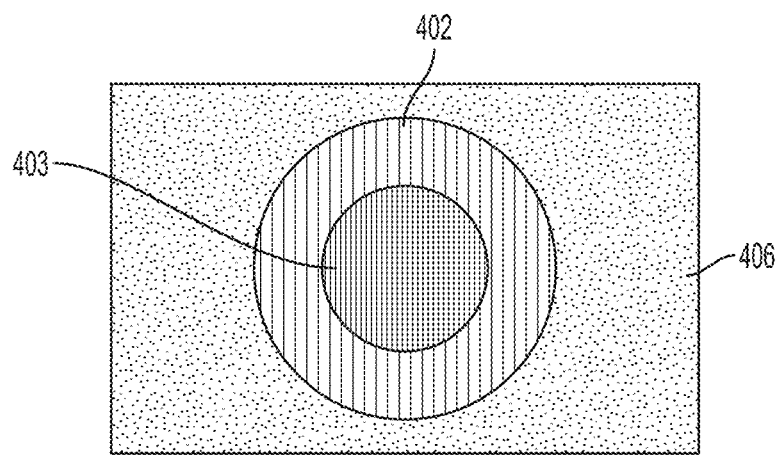
FIG. 4A illustrates a top view of an example fiducial marker design ("Design D"), according to examples of the disclosure.

FIG. 4A illustrates a top view of an example fiducial marker design ("Design D") in which a circular fine spacing surface relief profile area 403 is located on the surface of a glass substrate, within an annular course spacing surface relief profile area 402, which is itself within a surrounding blank area 406, as in Design C. In Design D, however, the placement of the fine spacing surface relief profile 403 and the course spacing surface relief profile area 402 are reversed with respect to Design C.

Figure 4B:
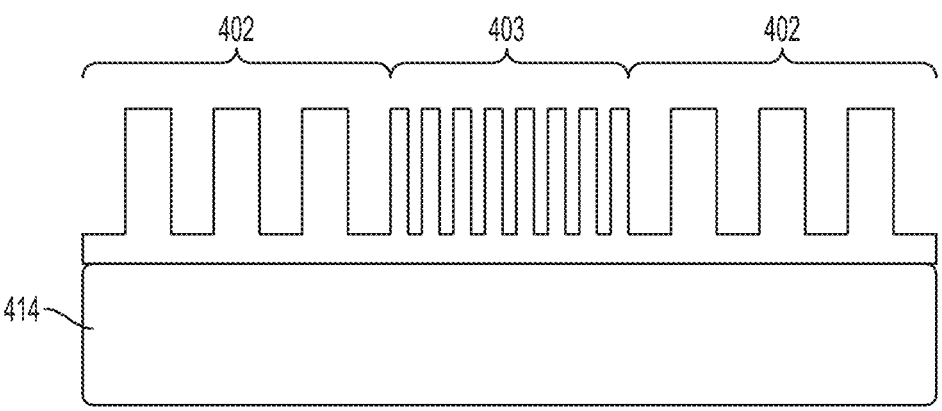
FIG. 4B illustrates a cross-sectional view of Design D, according to examples of the disclosure.

FIG. 4B illustrates a cross-sectional view of Design D. In Design D, a first surface relief profile area 403 may be encircled by a second surface relief profile area 402, as in Design C. In Design D, however, the first (circular) surface relief area 403 can have a finer pitch than the second (annular) surface relief profile area 402.

Design D, when illuminated, can show highly contrasted image regions. The first (circular) surface relief profile area 403 can appear as a dark area, and the second (annular) surface relief profile area 402 can appear as a bright area. The surrounding blank area 406 can also appear as a dark area. Due to the ring shape of the second (annular) surface relief profile area 402 as a bright area, Design D can present a fiducial marker that appears as a bright ring encircling a dark center to a machine vision system. There may be a sharp edge of contrasting brightness at the circular edge of the dark center, which can facilitate edge detection by a vision system, allowing the shape of the circular edge in a fiducial marker of Design D to be more easily recognized by the vision system.

Figure 4C:
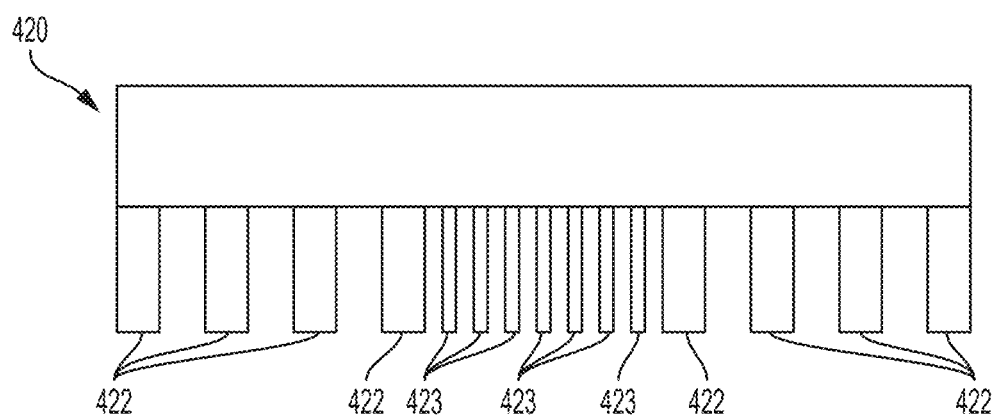
FIG. 4C illustrates Submaster D, according to examples of the disclosure.

FIG. 4C illustrates Submaster D, an example submaster plate 420 that can be used to impress Design D in a photocurable (e.g., ultraviolet light curable) coating on a glass substrate 414. Unlike example Submaster C, the protruding ridges 423 that form the first (circular) surface relief profile area 403 in example Submaster D may have a finer pitch than the protruding ridges 422 that form the second (annular) surface relief profile area 402.

Design E

Figure 5A:
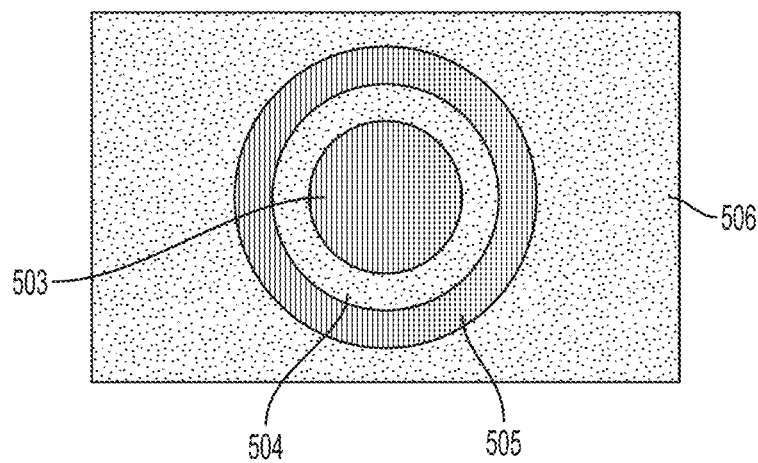
FIG. 5A illustrates a top view of an example fiducial marker design ("Design E"), according to examples of the disclosure.

FIG. 5A illustrates a top view of an example fiducial marker design ("Design E") in which a first (e.g., circular) fine spacing surface relief profile area 503 is located on the surface of a glass substrate, within a second (e.g., annular) fine spacing surface relief profile area 505, which is within a surrounding blank area 506, analogous to Design D. In Design E, however, there is a second blank area 504 in between the first fine spacing surface relief profile area 503 and the second fine spacing surface relief profile area 505. The second blank area 504 can include an unperturbed, substantially uniform thickness of photocurable material. This additional blank area 504 may be, e.g., an annular (ring-shaped) area. Additionally, in Design E, both the first and second fine spacing surface relief profile areas 503 and 505 can be have relatively low reflectivity compared to the blank areas 504 and 506. Exemplary specifications for the second (annular) blank area 504 include a diameter of 3 mm and an annular ring width of 1 mm. Exemplary specifications for the second (annular) fine spacing surface relief profile area 505 include a diameter of 4 mm, an annular ring width of 1 mm, and a linewidth/space of 0.23-1.0 μm.

Figure 5B:
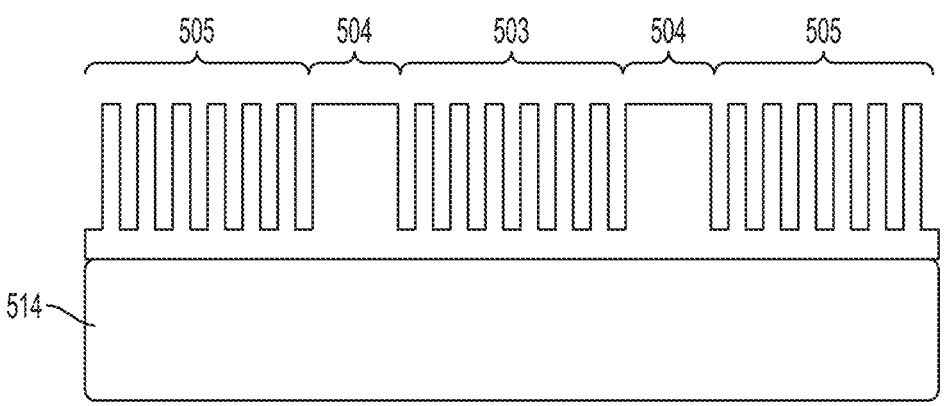
FIG. 5B illustrates a cross-sectional view of Design E, according to examples of the disclosure.

FIG. 5B illustrates a cross-sectional view of Design E. The first surface relief profile area 503 in Design E is analogous to the first surface relief profile area 403 in Design D. As in Design D, there is a second surface relief profile area 505; but in Design E, compared to Design D, both the first and second surface relief profile areas 503 and 505 can have the same pitch. In some examples, the annular blank area 504 and the surrounding blank area 506 in Design E can also be similar or identical in thickness.

Design E, when illuminated, can show highly contrasted image regions. Both the first and second fine spacing surface relief profile areas 503 and 505 can appear as dark areas. The first and second fine spacing surface relief profile areas 503 and 505 can also direct light radially toward the annular blank area 504. This directed light from the two fine spacing surface relief profile areas 503 and 505 may superimpose with reflected light from the annular blank area 504. The resulting visual effect may be an annular blank area that appears lit up, forming a ring-shaped bright area. The first and second fine spacing surface relief profile areas 503 and 505 can appear as particularly dark areas. Altogether, Design E can appear as a dark center, encircled by a bright ring, encircled by a dark ring (as in a "bullseye" design). Sharp edges of contrasting brightness at both the inner and outer circular edges of the annular blank area 504 can present detectable edges for the vision system, which may allow the shape of the fiducial marker of Design E to be easily recognized by the vision system.

Figure 5C:
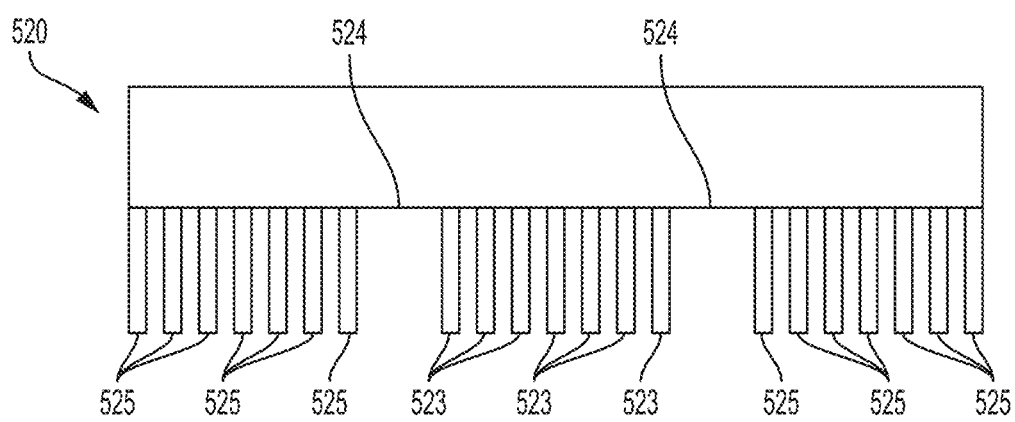
FIG. 5C illustrates Submaster E, according to examples of the disclosure.

FIG. 5C illustrates Submaster E, which is an example submaster plate 520 that can be used to impress Design E into a photocurable material coated on a transparent (e.g., glass) substrate 514. The protruding ridges 523 that form the first (circular) surface relief profile area 503 and the protruding ridges 525 that form the second (annular) surface relief profile area 505 can have the same height and the same pitch. The annular blank area 504 and the surrounding blank area 506 are formed by the wide recesses 524 in between the first and second surface relief profile areas and outside of the second surface relief profile area.

The above fiducial designs are examples and not intended to limit the scope of the disclosure. While the above examples are described with respect to specific shapes, such as circles, rings, and rectangles, they may also be implemented with other shapes, such as crosses and squares. Similarly, the example fine and course surface relief profile areas above are described with respect to straight bars oriented in a vertical direction (from top view), but may also be implemented with other patterns (from top view), such as concentric circles or polygons, curved bars, or straight bars in mixed orientations (e.g., some vertical and some horizontal).

Additionally, the above label "Design" is provided to facilitate ease of reference, but should not be understood as a strict designation that, for example, prevents the combination of features from one "Design" with another "Design." In other words, the features of each fiducial "Design" above are not limited to be found only in that "Design." Rather, individual features of one "Design" may be combined with individual features of another "Design."

Alternatively, either or both of the fine spacing surface relief profile and the course spacing surface relief profile may have lateral peak-to-peak spacing that is not fixed to a single value. For example, the lateral peak-to-peak spacing may vary according to a probability distribution.

Alternatively, either or both of the fine spacing surface relief profile and the course spacing surface relief profile may have surface heights that vary in two orthogonal directions along their surface. Examples include 2D periodic and 2D non-periodic profiles. An example of a 2D periodic pattern may be analogous to a chessboard-like pattern where the positions of the black squares are occupied by rectangular pillars of photocurable (e.g., ultraviolet light curable) material of a first height, and in the positions of the white squares the thickness of the photocurable (e.g., ultraviolet light curable) material is lower than the first height. In any case, the average lateral peak to peak-to-peak spacing of features (e.g., ridges) may be higher in a course spacing surface relief profile as compared to a fine spacing surface relief profile.

Manufacturing the Fiducial Markers

Figure 6A:
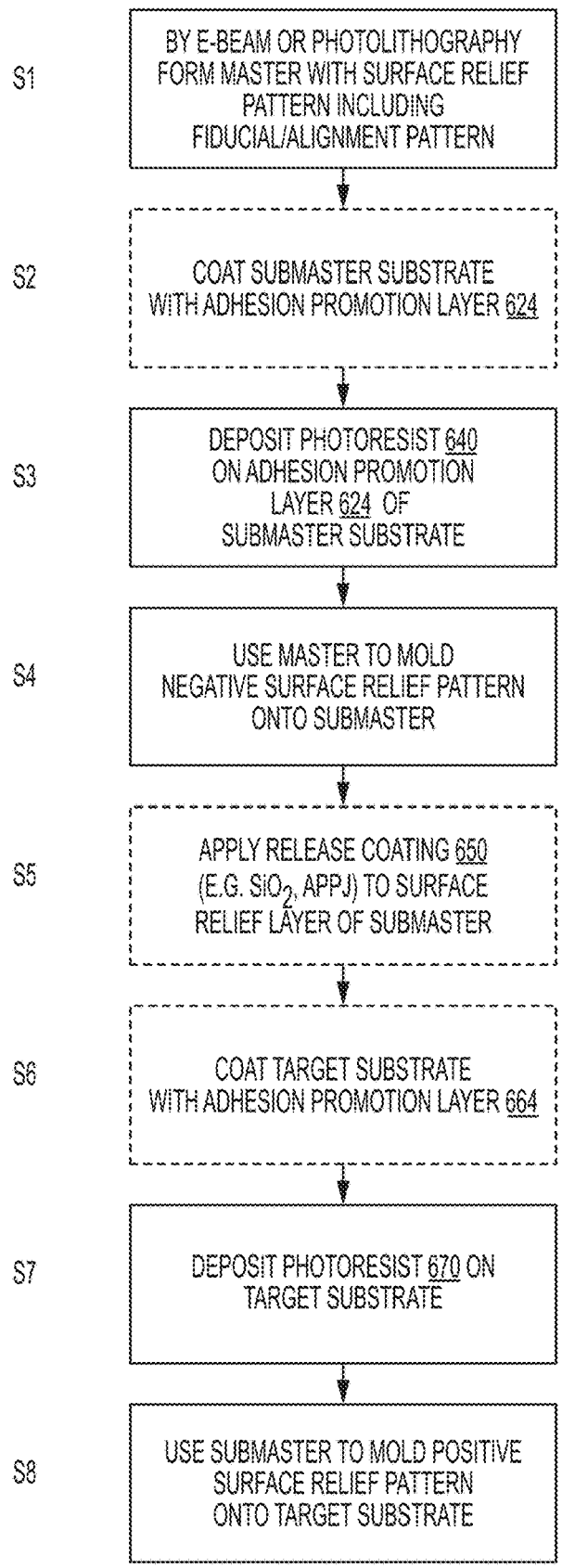
FIG. 6A presents a flow chart of an exemplary manufacturing method that can be used to implement example Designs A-E and Zone Designs B and C to manufacture fiducial markers, according to examples of the disclosure.
Figure 6B:
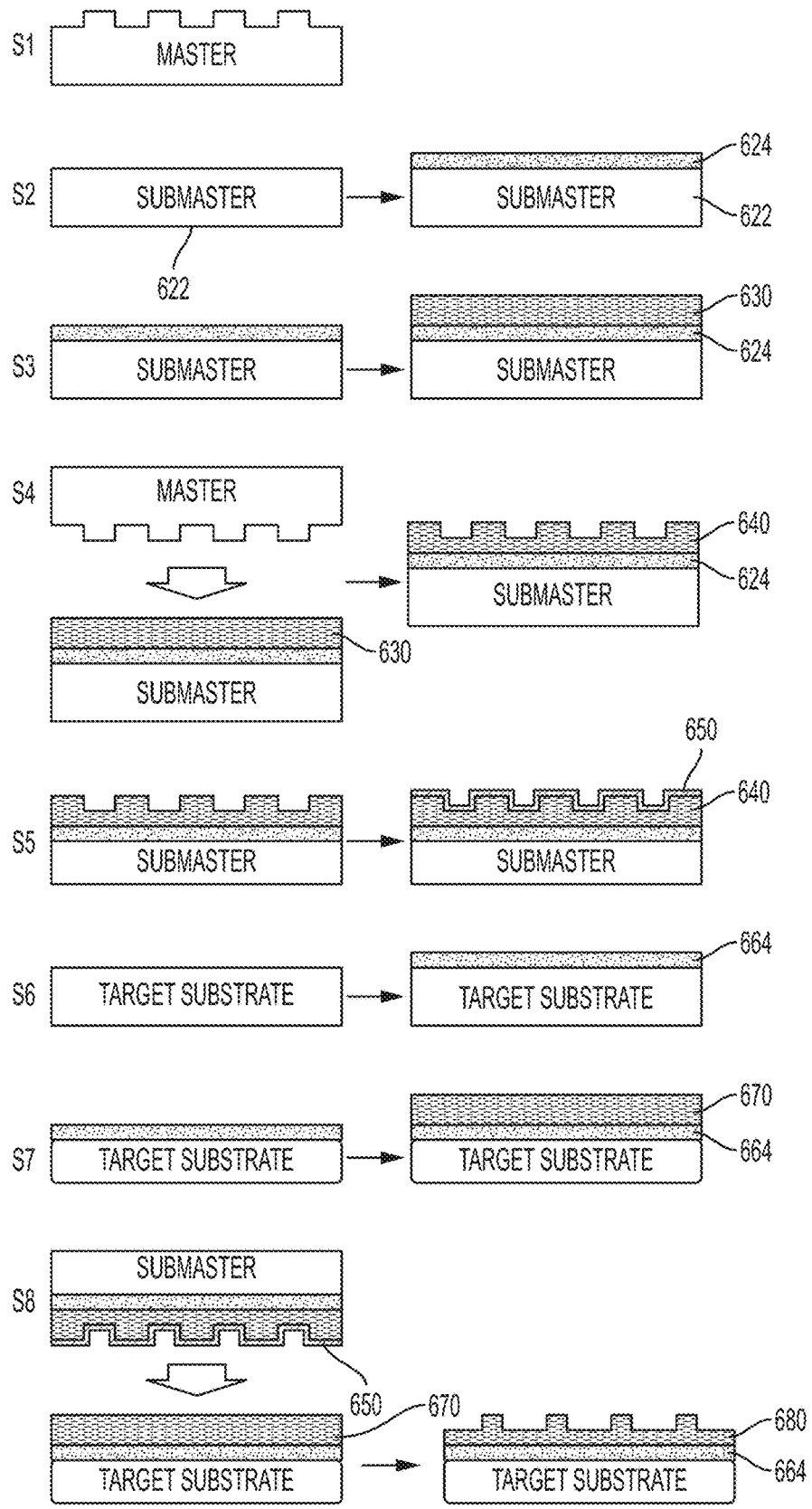
FIG. 6B illustrates the exemplary manufacturing method according to Steps S1-S8, according to examples of the disclosure.

FIGS. 6A and 6B present an exemplary manufacturing method that can be used to implement example Designs A-E and Zone Designs B and C to manufacture fiducial markers. Manufacturing the fiducial markers can involve two transfers of a fiducial design across multiple substrates.

In a first transfer, a target fiducial design (e.g., as shown in example Designs A-E and Zone Designs B and C) can be conveyed by a pattern on a master mold or plate, or master for short, as a starting point. The master can be made by electron beam processing (e-beam) or photolithography, for examples. The master can have a surface relief profile corresponding to the target fiducial design to be made. Then, the target fiducial design patterned on the master can be transferred as a negative of the fiducial design to a submaster mold or plate, or submaster for short. For example, this first transfer can involve pressing together the master and a blank mold that becomes the submaster. The blank mold can take the form of a substrate coated with a hardenable (e.g. photocurable) resin that, in its unhardened state, can be impressed (molded) with a pattern by use of the master.

In a second transfer, the submaster can convey a negative of the target fiducial design to a coating of hardenable (photocurable) material on a target glass substrate. For example, when pressed together with the hardenable coating on the target glass substrate, the submaster can form a positive pattern on the hardenable coating on the glass substrate. When the submaster is removed, the remaining positive pattern on the hardenable coating on the glass substrate can form a fiducial marker having the target fiducial design (e.g., example Designs A-E).

FIG. 6A presents a flow chart of the exemplary manufacturing method described in the following steps. A first transfer can be performed via Steps S1-S4. A second transfer can be performed via Steps S5-S8. As a visual aid, FIG. 6B illustrates the exemplary manufacturing method according to Steps S1-S8.

In example Step S1, a master can be formed having a surface relief pattern layer including the target fiducial design. The master can be made by e-beam lithography or photolithography, for examples. On the master, the surface relief pattern layer may look like one of the cross-sectional views of the Designs A-E, as in FIGS. 1B, 2B, 3B, 4B, and 5B.

In example Step S2, the base substrate 622 of a blank mold that becomes the submaster can be coated with an adhesion promotion layer 624, such as Valmat made by Molecular Imprints, Inc. of Austin, Tex.

In example Step S3, a coating 630 of hardenable (e.g., photocurable) material can be deposited over the adhesion promotion layer 624 of the blank mold.

In example Step S4, the master can be used to mold a negative surface relief pattern layer in the coating 630 of the hardenable material on the blank mold, thus transferring the target fiducial design as a negative to the hardenable material on the submaster. For example, the master can be used as a press mold to make an impression in the hardenable material on the blank mold, thus forming the negative surface relief pattern of the submaster. Having the impression, the hardenable material on the submaster may be cured, for example, by photocuring processes. Adhering to the adhesion promotion layer 624 on the base substrate of the submaster, the cured layer 640 may separate from the master when the master is removed.

In example Step S5, a separation release coating 650 (e.g., $SiO_2$, Atmospheric Pressure Plasma Jet (APPJ)) can be applied to the surface relief pattern layer 640 of the submaster.

In example Step S6, the target substrate can be coated with an adhesion promotion layer 664, such as Valmat. The target substrate may be glass (or other transparent or translucent material) for marking with the target fiducial design (e.g., example Designs A-E and Zone Designs B and C).

In example Step S7, a hardenable (e.g., photocurable) material 670 can be deposited onto the target substrate. The hardenable material 670 can be deposited over the adhesion promotion layer 664.

In example Step S8, the submaster can be used to mold a positive surface relief pattern layer in the coating 670 of the hardenable material on the target substrate, thus transferring the target fiducial design (e.g., example Designs A-E) as a positive to the hardenable material 670 on target substrate. For example, the submaster can be used as a press mold to make an impression in the hardenable material 670 on the target substrate, thus forming the positive surface relief pattern. The positive surface relief pattern layer 680 can adhere to the adhesion promotion layer 664 on the target substrate. The separation release coating 650 (e.g., $SiO_2$, APPJ) on the submaster can promote smooth separation of the submaster from the target substrate.

Applying the Fiducial Markers

After a substrate is marked with a fiducial marker, the fiducial marker can facilitate the use of the substrate in a variety of applications. Exemplary applications include manufacturing processes in industrial environments where fiducial markers can be useful for providing visual points of reference, such as for precision alignment of components on the substrate or precision alignment of the substrate in a cutting machine that cuts the substrate into multiple parts (e.g., augmented reality eyepieces).

Figure 7:
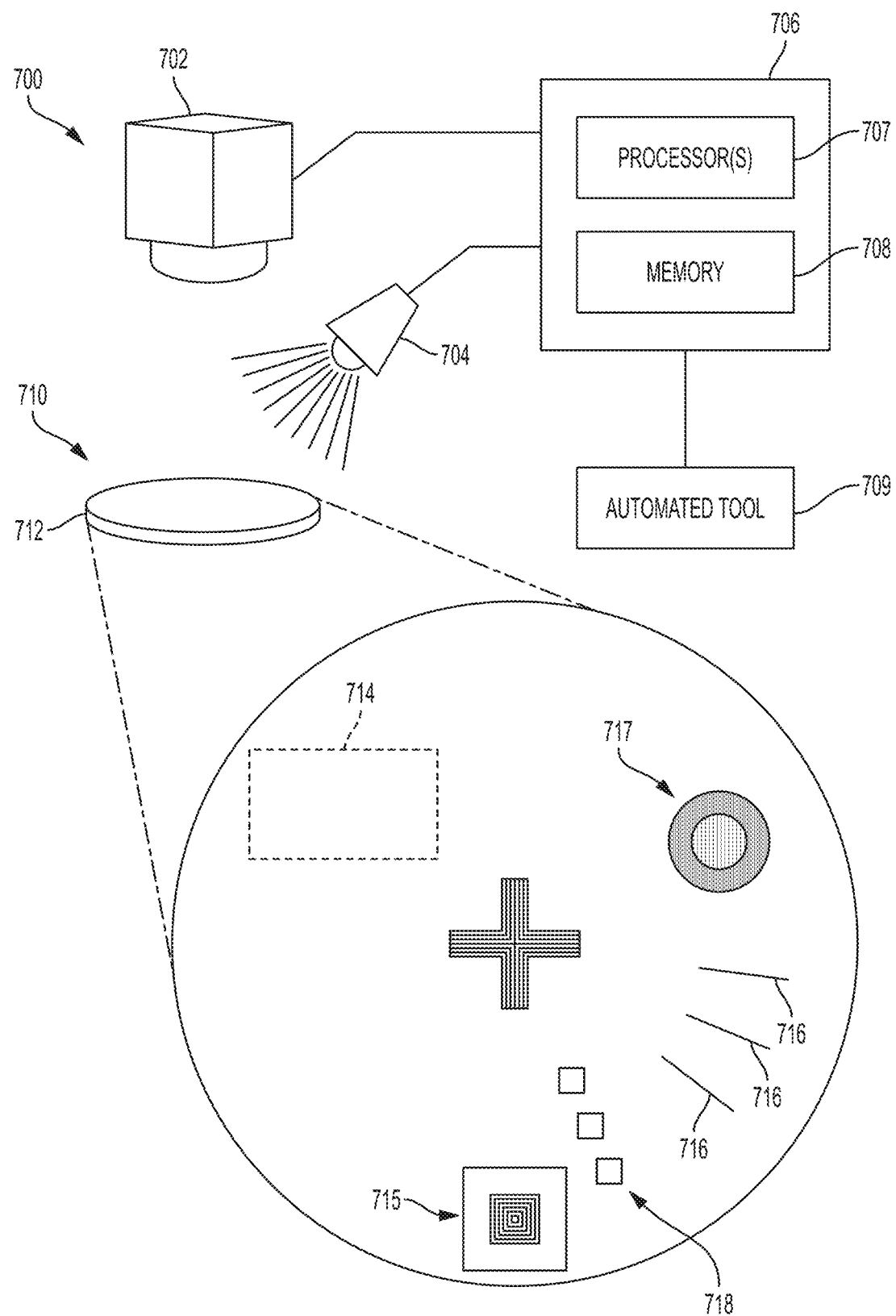
FIG. 7 illustrates exemplary applications for manufacturing processes involving machine vision systems, according to examples of the disclosure.

FIG. 7 illustrates exemplary applications for manufacturing processes involving machine vision systems. A machine vision system 700 can facilitate automated performance of manufacturing processes on input working material, and fiducial markers can aid the machine vision system 700. When receiving an input piece of working material, or workpiece 710, the vision system may determine the input orientation of the workpiece 710. For example, even before manufacturing processes are performed on the workpiece 710, the vision system 700 may determine, for example, which side of the workpiece 710 is up, which side is down, which direction is left, which direction is right, etc., relative to a predetermined manufacturing process plan in the vision system 700.

After the input orientation of the workpiece 710 is determined, the workpiece 710 can be maneuvered into a working orientation suited for performing manufacturing processes on the workpiece 710. Exemplary manufacturing processes include cutting into the workpiece 710 and placing material or a component on the workpiece 710. The workpiece 710 can be in the form of a target substrate, and another exemplary manufacturing process can be pressing together the target substrate and an additional substrate into a stack of substrates. Such workpieces and substrates can be at least partially formed of glass or other transparent or translucent material.

In some examples, fiducial markers can mark portions of workpieces and substrates formed of glass or other transparent or translucent material. For example, a camera 702 of a machine vision system 700 can view a target glass wafer 712 marked with two or more fiducial markers, each having one of the fiducial designs described above. A light source, such as a lamp 704, can illuminate the target glass wafer 712. Image data from the camera 702 can be processed by an image processing system 706 of the vision system 700.

In some examples, an image processing system 706 of the vision system 700 can recognize each of the fiducial markers. For example, the image processing system 706 may detect visual edges in image data from a camera 702. Certain detected visual edges can correspond to a fiducial marker, delineating one or more shapes in the fiducial marker's design. As described above, a visual edge can arise from a visual distinction between contrasting image regions in the image data. The visual distinction may be based on, for example, differences in brightness. The visual distinction may be based on differences in visual effects, for example, provided by the surface-relief-pattern-based designs described above. In some examples, the vision system can store a predetermined fiducial design in storage memory 708 for later access. Based on edge detection of visual edges in the image data, an image processing system 706 can determine a match between a fiducial marker on a glass wafer and the predetermined fiducial design. Enhanced edge detection related to the design of the fiducial marker can facilitate identification and processing of the fiducial marker by the vision system 700. Processes performed by the image processing system 706 may be performed by one or more processors 707.

In addition to recognizing the fiducial markers on the target glass wafer 712, an image processing system 706 of a vision system 700 may determine an input orientation of the wafer 712. For example, information about the wafer's fiducial markers (e.g., location, design, etc.) may correspond to information on a reference template that indicates the wafer's input orientation. In some examples, reference templates can be stored in the storage memory 708 of the vision system.

In addition to determining the input orientation of the target glass wafer 712 based on fiducial markers, the machine vision system 700 may facilitate implementing manufacturing processes on the wafer 712. For example, predetermined manufacturing processes may be included in a manufacturing process plan for the wafer 712, and automated tools 709 (e.g., robotic tools) may be directed to perform them in accordance with the determined orientation from an image processing system 706. In some examples, using a radial direction between two fiducial markers 715 and 717, a cutting tool can be directed to form cuts 716 into the glass wafer 712, or a P&P machine can be directed to place a line of components 718. In some examples, a pressing tool can be directed to press together a target glass wafer and another wafer with identical fiducial markers, so that the two wafers are aligned with respect to their fiducial markers.

Target locations for manufacturing processes can also be determined based on fiducial markers on a target glass wafer. An example manufacturing process plan for the wafer can include certain manufacturing processes to be performed by certain automated tools at predetermined locations relative to predetermined fiducial markers in the plan stored in a storage memory of a vision system. In some examples, in accordance with predetermined locations in a stored plan, an image processing system 706 can determine corresponding target locations on the target glass wafer 712 for those certain manufacturing processes to be performed. For example, in a target location 714 in a quadrant opposite from the wafer's fiducial markers, a cutting tool can be directed to cut out a desired shape from the glass wafer 712, or a P&P machine can be directed to place a cluster of components.

A storage memory of a machine vision system can be one or more instances of any suitable non-transitory machine-readable storage medium, such as RAM, ROM, flash memory, semiconductor memory, hard disk, solid-state memory, etc. The above example processes of a machine vision system may be provided by any suitable logic circuitry. Suitable logic circuitry may include one or more computer processors (e.g., CPU, GPU, etc.) that, when executing instructions implemented in a software program, perform the processes. Additionally, such processes can also be provided via corresponding logic design implemented in hardware logic circuitry, such as programmable logic (e.g., PLD, FPGA, etc.) or customized logic (e.g., ASIC, etc.) implementing logic designs that provide the processes. Furthermore, such processes can be provided via an implementation that combines both one or more processors running software and hardware logic circuitry.

In some examples, a method of marking a target substrate with a target fiducial marker having a target fiducial design is disclosed. The method may comprise: forming a master mold having a master surface relief pattern layer including the target fiducial design; transferring a negative of the target fiducial design to a blank mold by pressing together the master mold and the blank mold, thereby forming a submaster mold; separating the master mold and the submaster mold, the negative of the target fiducial design transferred to the submaster mold as a submaster surface relief pattern layer on the submaster mold; depositing hardenable material onto the target substrate; transferring the target fiducial design to the target substrate by pressing together the submaster mold and the target substrate; and separating the submaster mold and the target substrate, the target fiducial design transferred to the target substrate as a target surface relief pattern layer in the hardenable material deposited onto the target substrate, the target surface relief pattern layer marking the target substrate with the target fiducial marker having the target fiducial design. Additionally or alternatively to one or more of the above examples, the method may comprise: coating a base substrate of the blank mold with an adhesion promotion layer; and depositing hardenable material on the adhesion promotion layer, before the master mold and the blank mold are pressed together, wherein the submaster surface relief pattern layer, formed from the hardenable material, adheres to the adhesion promotion layer coating the base substrate of the submaster mold, after the master mold and the blank mold are pressed together. Additionally or alternatively to one or more of the above examples, the method may comprise: depositing hardenable material onto a mold substrate, the hardenable material filling contours of the master surface relief pattern layer when the master mold and the blank mold are pressed together; and hardening the hardenable material, the hardened material forming the submaster surface relief pattern layer including the negative of the target fiducial design. Additionally or alternatively to one or more of the above examples, the method may comprise: applying a separation release coating onto the submaster surface relief pattern layer on the submaster mold, wherein the separation release coating promotes the separation of the submaster mold and the target substrate. Additionally or alternatively to one or more of the above examples, the method may comprise: coating the target substrate with an adhesion promotion layer, wherein the hardenable material is deposited onto the target substrate over the adhesion promotion layer coating the target substrate, wherein the target surface relief pattern layer adheres to the adhesion promotion layer coating the target substrate. Additionally or alternatively to one or more of the above examples, the submaster mold may be a press mold including the submaster surface relief pattern layer on the submaster mold, wherein the press mold impresses the target surface relief pattern layer in the hardenable material deposited onto the target substrate. Additionally or alternatively to one or more of the above examples, the target substrate may include a glass or other transparent or translucent material bearing a material which is marked with the target fiducial design. Additionally or alternatively to one or more of the above examples, the target surface relief pattern layer may comprise one or more surface relief profile areas that presents at least one bright image region for edge detection by a machine vision system.

In some examples, a method of implementing a manufacturing process plan on a target substrate is disclosed. The method may comprise: storing one or more predetermined fiducial designs in one or more memories of a machine vision system; storing the manufacturing process plan in the one or more memories of the machine vision system; viewing the target substrate by a camera of the machine vision system, the target substrate marked with a plurality of target fiducial markers, each having a respective target fiducial design including one or more surface relief profile areas; recognizing each of the plurality of target fiducial markers by one or more processors of the machine vision system, comprising: detecting one or more visual edges that delineate one or more shapes in the respective target fiducial design, each visual edge based on a visual distinction between a plurality of image regions including: a first image region visually presenting a surface relief profile area in the respective target fiducial design and a second image region visually presenting an area adjacent the surface relief profile area in the respective target fiducial design, determining a match between the respective target fiducial design and one of the one or more stored predetermined fiducial designs, based on the detected one or more edges of the target fiducial design; determining an orientation of the target substrate based on the recognized target fiducial markers, by the one or more processors of the machine vision system; and performing a manufacturing process on the target substrate in accordance with the determined orientation, the manufacturing process included in the stored manufacturing process plan. Additionally or alternatively to one or more of the above examples, for a first target fiducial marker of the plurality of target fiducial markers, the one or more visual edges may be detected based on the plurality of image regions including: the first image region visually presenting a course spacing surface relief profile area in the target fiducial design of the first target fiducial marker and the second image region visually presenting a fine spacing surface relief profile area adjacent the course spacing surface relief profile area in the target fiducial design of the first target fiducial marker. Additionally or alternatively to one or more of the above examples, for a first target fiducial marker of the plurality of target fiducial markers, the one or more visual edges may be detected based on the plurality of image regions including: the first image region visually presenting a first fine spacing surface relief profile area in the target fiducial design of the first target fiducial marker, the second image region visually presenting a blank area surrounding the fine spacing surface relief profile area in the target fiducial design of the first target fiducial marker, and a third image region visually presenting a second fine spacing surface relief profile area surrounding the blank area in the target fiducial design of the first target fiducial marker. Additionally or alternatively to one or more of the above examples, the method may comprise: determining a target location on the target substrate relative to one or more of the target fiducial markers, in accordance with a predetermined location relative to predetermined fiducial markers in the stored manufacturing process plan; and performing the manufacturing process on the target substrate at the determined target location. Additionally or alternatively to one or more of the above examples, the manufacturing process on the target substrate may include at least one of: cutting into the target substrate, placing material or a component on the target substrate, and pressing together the target substrate and an additional substrate.

In some examples, a substrate marked with a fiducial marker is disclosed. The substrate may comprise: a first surface relief profile area on the substrate; and a surrounding area, surrounding the first surface relief profile area, on the substrate, wherein the fiducial marker includes at least the first surface relief profile area, and wherein, when viewed by a machine vision system, the fiducial marker appears as a first image region visually presenting a bright image region. Additionally or alternatively to one or more of the above examples, the first surface relief profile area may comprise: periodically spaced features that vertically extend from the substrate, the periodically spaced features having their bases at a base level, and wherein the surrounding area is a blank area of field material, the blank area having its top at or below the base level of the periodically spaced features of the first surface relief profile area. Additionally or alternatively to one or more of the above examples, the fiducial marker may include the blank area in a rectangular shape on the substrate, surrounding the first surface relief profile area, wherein, when viewed by a machine vision system, the fiducial marker appears as a plurality of image regions including: the first image region visually presenting the first surface relief profile area as a bright image region and a second image region visually presenting the blank area as a dark image region. Additionally or alternatively to one or more of the above examples, the substrate may comprise: a second surface relief profile area, surrounding the first surface relief profile area, on the substrate, wherein the first surface relief profile area is a course spacing surface relief profile area and the second surface relief profile area is a fine spacing surface relief profile area, wherein the surrounding area surrounds both the course spacing surface relief profile area and the fine spacing surface relief profile area, wherein the fiducial marker includes at least the course spacing surface relief profile area and the fine spacing surface relief profile area, wherein, when viewed by a machine vision system, the fiducial marker appears as a plurality of image regions including: the first image region visually presenting the course spacing surface relief profile area as a bright image region and a second image region visually presenting the fine spacing surface relief profile area as a dark image region. Additionally or alternatively to one or more of the above examples, the fiducial marker may include the fine spacing surface relief profile area in a rectangular shape on the substrate, surrounding the course spacing surface relief profile area. Additionally or alternatively to one or more of the above examples, the substrate may comprise: a second surface relief profile area, surrounded by the first surface relief profile area, on the substrate, wherein the first surface relief profile area is a course spacing surface relief profile area and the second surface relief profile area is a fine spacing surface relief profile area, wherein the surrounding area surrounds both the course spacing surface relief profile area and the fine spacing surface relief profile area, wherein the fiducial marker includes at least the course spacing surface relief profile area and the fine spacing surface relief profile area, wherein, when viewed by a machine vision system, the fiducial marker appears as a plurality of image regions including: the first image region visually presenting the course spacing surface relief profile area as a bright image region and a second image region visually presenting the fine spacing surface relief profile area as a dark image region. Additionally or alternatively to one or more of the above examples, the substrate may comprise: a blank area of field material as the surrounding area surrounding the first surface relief profile area; and a second surface relief profile area, surrounding the blank area, on the substrate; wherein the fiducial marker includes at least the first surface relief profile area, the blank area, and the second surface relief profile area, wherein, when viewed by a machine vision system, the fiducial marker appears as a plurality of image regions including: the first image region visually presenting the first surface relief profile area as a dark image region, and a second image region visually presenting the blank area as a bright image region, and a third image region visually presenting the second surface relief profile area as a dark image region.

Although the disclosed examples have been fully described with reference to the accompanying drawings, it is to be noted that various changes and modifications will become apparent to those skilled in the art. Such changes and modifications are to be understood as being included within the scope of the disclosed examples as defined by the appended claims.

The invention claimed is:

1. A method of marking a target substrate with a target fiducial marker having a target fiducial design, the method comprising:
   forming a master mold having a master surface relief pattern layer including the target fiducial design;
   transferring a negative of the target fiducial design to a first mold by pressing together the master mold and the first mold;
   separating the master mold and the first mold, the negative of the target fiducial design transferred to the first mold in a first surface relief pattern layer on the first mold;
   depositing hardenable material onto the target substrate;
   transferring the target fiducial design to the target substrate by pressing together the first mold and the target substrate; and
   separating the first mold and the target substrate, the target fiducial design transferred to the target substrate in a target surface relief pattern layer in the hardenable material deposited onto the target substrate, the target surface relief pattern layer marking the target substrate with the target fiducial marker having the target fiducial design.

2. The method of claim 1, further comprising:
   coating a base substrate of the first mold with an adhesion promotion layer; and
   depositing hardenable material on the adhesion promotion layer, before the master mold and the first mold are pressed together,
   wherein the first surface relief pattern layer is formed from the hardenable material and adheres to the adhesion promotion layer coating the base substrate of the first mold after the master mold and the first mold are pressed together.

3. The method of claim 1, further comprising:
   depositing hardenable material onto a mold substrate, the hardenable material filling contours of the master surface relief pattern layer when the master mold and the first mold are pressed together; and
   hardening the hardenable material, the hardened material forming the first surface relief pattern layer.

4. The method of claim 1, further comprising:
   applying a separation release coating to the first surface relief pattern layer,
   wherein the separation release coating promotes the separation of the first mold and the target substrate.

5. The method of claim 1, further comprising:
   coating the target substrate with an adhesion promotion layer, wherein the hardenable material is deposited onto the target substrate over the adhesion promotion layer coating the target substrate, wherein the target surface relief pattern layer adheres to the adhesion promotion layer coating the target substrate.

6. The method of claim 1, wherein the first mold comprises a press mold including the first surface relief pattern layer, and wherein the press mold impresses the target surface relief pattern layer in the hardenable material deposited onto the target substrate.

7. The method of claim 1, wherein the target substrate comprises a transparent material which is marked with the target fiducial design.

8. The method of claim 1, wherein the target surface relief pattern layer comprises a surface relief profile area that presents a bright image region corresponding to an edge of the target fiducial marker.

* * * * *